US 12,127,348 B2

(12) United States Patent
Tsuri

(10) Patent No.: US 12,127,348 B2
(45) Date of Patent: Oct. 22, 2024

(54) COMPONENT ADSORPTION NOZZLE AND COMPONENT MOUNTING SYSTEM

(71) Applicant: YAMAHA HATSUDOKI KABUSHIKI KAISHA, Iwata (JP)

(72) Inventor: Kenji Tsuri, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 471 days.

(21) Appl. No.: 17/763,155

(22) PCT Filed: Sep. 25, 2019

(86) PCT No.: PCT/JP2019/037473
§ 371 (c)(1),
(2) Date: Mar. 23, 2022

(87) PCT Pub. No.: WO2021/059376
PCT Pub. Date: Apr. 1, 2021

(65) Prior Publication Data
US 2022/0361386 A1 Nov. 10, 2022

(51) Int. Cl.
*H05K 13/04* (2006.01)
*B65G 47/91* (2006.01)

(52) U.S. Cl.
CPC ......... *H05K 13/0411* (2018.08); *B65G 47/91* (2013.01); *H05K 13/0413* (2013.01); *H05K 13/0409* (2018.08)

(58) Field of Classification Search
CPC ........... H05K 13/0411; H05K 13/0413; H05K 13/0409; B65G 47/91
See application file for complete search history.

(56) References Cited

U.S. PATENT DOCUMENTS

| 4,461,610 | A | * | 7/1984 | Harigane | ........... | H05K 13/0409 |
| | | | | | | 271/103 |
| 4,794,689 | A | * | 1/1989 | Seno | .................... | H05K 13/082 |
| | | | | | | 29/743 |
| 5,255,429 | A | * | 10/1993 | Nishi | .................. | H05K 13/087 |
| | | | | | | 29/743 |
| 6,088,911 | A | * | 7/2000 | Isogai | ................ | H05K 13/0413 |
| | | | | | | 198/470.1 |

(Continued)

FOREIGN PATENT DOCUMENTS

| JP | 2003283187 A | * | 10/2003 |
| JP | 2018-046122 A | | 3/2018 |

(Continued)

OTHER PUBLICATIONS

International Search Report issued in PCT/JP2019/037473; mailed Nov. 26, 2019.

*Primary Examiner* — Jeffrey T Carley
(74) *Attorney, Agent, or Firm* — Studebaker & Brackett PC

(57) ABSTRACT

In a component adsorption nozzle, the nozzle can be attached to both of the in-line shaft and the rotary shaft by utilizing the outside (outer wall) of the nozzle body for attaching to the in-line shaft and utilizing the inside (inner wall) of the nozzle body for attaching to the rotary shaft. Therefore, for a user who owns each of the in-line type and rotary type component mounters, it is not necessary to prepare a nozzle dedicated to each type component mounter and it is possible to reduce the burden required for preparing the nozzle.

4 Claims, 10 Drawing Sheets

(56) References Cited

U.S. PATENT DOCUMENTS

| | | | | |
|---|---|---|---|---|
| 6,553,659 B1 * | 4/2003 | Ida | ............... | H05K 13/0409 29/840 |
| 2001/0035659 A1 * | 11/2001 | Suhara | ............... | H05K 13/0409 294/185 |
| 2002/0027207 A1 * | 3/2002 | Suhara | ............... | H05K 13/0409 250/559.29 |
| 2002/0029468 A1 * | 3/2002 | Koike | ............... | H05K 13/0409 29/832 |
| 2002/0124393 A1 * | 9/2002 | Suhara | ............... | H05K 13/0413 29/743 |
| 2002/0184755 A1 * | 12/2002 | Suhara | ............... | H05K 13/0069 29/739 |

FOREIGN PATENT DOCUMENTS

| | | | | |
|---|---|---|---|---|
| WO | WO-0033630 A1 * | 6/2000 | ......... | H05K 13/0408 |
| WO | WO-2016135869 A1 * | 9/2016 | ......... | H05K 13/0404 |

\* cited by examiner

COMPONENT ADSORPTION NOZZLE AND COMPONENT MOUNTING SYSTEM

CROSS-REFERENCE TO RELATED APPLICATION

This application is a National Stage of International Patent Application No. PCT/JP2019/037473, filed Sep. 25, 2019, the entire contents of which is incorporated herein by reference.

BACKGROUND

Technical Field

The present disclosure relates to a technique for attaching a component adsorption nozzle to a mounting head which mounts a component adsorbed by the component adsorption nozzle attached to a lower end of the mounting head on a board.

Background Art

Conventionally, well known is a component mounter which transfers the component onto a board by a mounting head while adsorbing the component by a component adsorption nozzle attached to a lower end of the mounting head. Further, as shown in Japanese Patent Application Laid Open Gazette No. 2018-046122, the component adsorption nozzle is generally attached detachably to the mounting head so that the component adsorption nozzle can be changed depending on the kind of component to be mounted on a board.

SUMMARY

As the mounting head used in the component mounter, there are two types of heads, i.e., an in-line head and a rotary head. The in-line head has a plurality of in-line shafts arranged linearly, and the component adsorption nozzle is attached to a lower end of each of the in-line shafts. On the other hand, the rotary head has a plurality of rotary shafts arranged circumferentially, and the component adsorption nozzle is attached to a lower end of each of the rotary shafts.

These mounting heads include different configurations depending on the difference of use. Specifically, since the in-line head is used to adsorb various components from a small-size one to a large-size one, the in-line shafts are arranged at a relatively wide pitch. On the other hand, since the rotary head is used to adsorb many small-size components at one time, the rotary shafts are arranged at a relatively narrow pitch. Then, depending on such a difference in the arrangement of the shafts, there is a difference in the attaching mechanism of the component adsorption nozzle.

Specifically, the in-line head has a pair of flat springs at the lower end of the in-line shaft and the pair of flat springs pinches the component adsorption nozzle by elastic forces thereof, to attach the component adsorption nozzle to the in-line shaft. On the other hand, in the rotary head, since the rotary shafts are arranged at a narrow pitch, there is no space to dispose a pair of flat springs. Then, a fitting hole into which a fitting portion at the lower end of the rotary shaft can be fitted is formed in the component adsorption nozzle, and a attaching mechanism of the component adsorption nozzle is thereby provided inside the fitting hole. Specifically, an engagement portion is provided inside the fitting hole, the component adsorption nozzle is attached to the rotary shaft by biasing the component adsorption nozzle downward by a biasing member while engaging an engagement portion to an engaged portion of the fitting portion from above, the fitting portion being fitted into the fitting hole.

According to the mounting mechanism of the rotary head, when the biasing member cannot sufficiently counter against an impact imposed on the component adsorption nozzle at component mounting, the component adsorption nozzle is detached from the rotary shaft. Then, in the component adsorption nozzle to be attached to the rotary shaft, a nozzle lower end portion is attached to a nozzle body movably up and down, and a spring coil (buffer member) is biasing the nozzle lower end portion downward so that the component adsorption nozzle is prevented from being detached by the impact at the component mounting.

Such a configuration is suitable to the rotary head for small-size components, however, but is not suitable to the in-line head for not only small-size components but also large-size components. With allowance between the nozzle body and the nozzle lower end portion, a rotation position of the component to be adsorbed by the component adsorption nozzle is sometimes deviated. Such positional deviation does not matter in mounting of a small-size component but matters in mounting of a large-size component. Therefore, a rigid component adsorption nozzle needs to be attached to the in-line head.

From the above-described circumstances, it has been thought that a dedicated component adsorption nozzle needs to be attached to each of the in-line head and the rotary head. As a result, a user who owns each of the in-line type and rotary type component mounters needs to prepare many kinds of component adsorption nozzles.

Accordingly, the present disclosure provides a technique to make it possible for a user who owns each of in-line type and rotary type component mounters to reduce the burden required for preparing a component adsorption nozzle.

A component adsorption nozzle according to the disclosure comprises a nozzle body having a fitting hole which is opened upward; an engagement portion provided inside the fitting hole; a pair of engagement projections provided outside the nozzle body, projecting sideward; a nozzle lower end portion attached to the nozzle body movably up and down, which comes into contact with a component in order to adsorb the component; and a buffer member biasing the nozzle lower end portion downward with respect to the nozzle body. An engaged portion provided on a lower end of one of a plurality of rotary shafts, which are arranged circumferentially and included in a rotary head, is fitted into the fitting hole from above. The engagement portion is engaged with the engaged portion by coming into contact from above with the engaged portion which is fitted into the fitting hole. Engagement between the engagement portion and the engaged portion is kept by biasing the nozzle body downward by a biasing member of the rotary head. The pair of engagement projections are engaged from above with a pair of engaged projections provided on a pair of elastic members, respectively, which are provided on a lower end of one of a plurality of in-line shafts which are arranged linearly and included in an in-line head, by entering between the pair of engaged projections from below while separating the pair of engaged projections from each other against an elastic force of the elastic members, and engagement between the engagement projections and the engaged projections is kept by the elastic force of the pair of elastic members.

A component mounting system according to the disclosure comprises a rotary type component mounter including a rotary head which has a plurality of rotary shafts arranged circumferentially and mounts a component onto a board by adsorbing the component by a component adsorption nozzle attached to a lower end of one of the rotary shafts; and an in-line type component mounter including an in-line head which has a plurality of in-line shafts arranged linearly and mounts a component onto a board by adsorbing the component by a component adsorption nozzle attached to a lower end of one of the in-line shafts. The component adsorption nozzle comprises a nozzle body having a fitting hole which is opened upward, an engagement portion provided inside the fitting hole, a pair of engagement projections provided outside the nozzle body, projecting sideward, a nozzle lower end portion attached to the nozzle body movably up and down, which comes into contact with a component in order to adsorb the component, and a buffer member biasing the nozzle lower end portion downward with respect to the nozzle body. An engaged portion provided on a lower end of one of the plurality of rotary shafts is fitted into the fitting hole from above. The engagement portion is engaged with the engaged portion by coming into contact from above with the engaged portion which is fitted into the fitting hole. Engagement between the engagement portion and the engaged portion is kept by biasing the nozzle body downward by a biasing member of the rotary head. The pair of engagement projections are engaged from above with a pair of engaged projections provided on a pair of elastic members, respectively, which are provided on a lower end of one of a plurality of in-line shafts which are arranged linearly and included in an in-line head, by entering between the pair of engaged projections from below while separating the pair of engaged projections from each other against an elastic force of the elastic members, and engagement between the engagement projections and the engaged projections is kept by the elastic force of the pair of elastic members.

In the present disclosure (the component adsorption nozzle and the component mounting system) having such a configuration, outside the nozzle body of the component adsorption nozzle, provided are the pair of engagement projections projecting sideward. The pair of engagement projections are engaged from above with the pair of engaged projections, respectively, which are provided on the pair of elastic members provided on the lower end of the in-line shaft, by entering between the pair of engaged projections from below while separating the pair of engaged projections from each other against the elastic force of the elastic members. Then, with the engagement between the engagement projections and the engaged projections being kept by the elastic force of the pair of elastic members, the component adsorption nozzle is attached to the in-line shaft.

Further, the nozzle body of the component adsorption nozzle is provided with the fitting hole opened upward and the engagement portion provided inside the fitting hole. The engaged portion provided on the lower end of the rotary shaft is fitted into the fitting hole from above, and the engagement portion of the component adsorption nozzle is engaged with the engaged portion by coming into contact from above with the engaged portion which is fitted into the fitting hole. Then, with the engagement between the engagement portion and the engaged portion being kept by biasing the nozzle body downward by the biasing member which the rotary head has, the component adsorption nozzle is attached to the rotary shaft.

Thus, the component adsorption nozzle of the present disclosure can be attached to both of the in-line head and the rotary head by utilizing the outside of the nozzle body for attaching to the in-line head and utilizing the inside of the nozzle body for attaching to the rotary head. Therefore, for a user who owns each of the in-line type and rotary type component mounters, it is not necessary to prepare a component adsorption nozzle dedicated to each type component mounter and it is possible to reduce the burden required for preparing the component adsorption nozzle.

The component adsorption nozzle may be configured so that the engagement portion has a recessed portion and the engaged portion has a protruding portion, and the recessed portion of the engagement portion and the protruding portion of the engaged portion are engaged with each other. In such a configuration, the component adsorption nozzle can be attached onto the rotary head with a simple configuration in which the recessed portion and the protruding portion are engaged with each other.

The component adsorption nozzle may be configured so that the engagement portion has a protruding portion and the engaged portion has a recessed portion, and the protruding portion of the engagement portion and the recessed portion of the engaged portion are engaged with each other. In such a configuration, the component adsorption nozzle can be attached onto the rotary head with a simple configuration in which the recessed portion and the protruding portion are engaged with each other.

According to the present disclosure, it becomes possible for a user who owns each of in-line type and rotary type component mounters to reduce the burden required for preparing a component adsorption nozzle.

DETAILED DESCRIPTION

Figure 1:
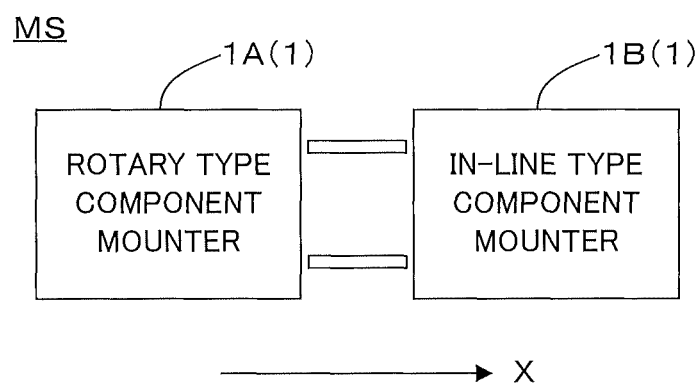
FIG. 1 is a block diagram showing an exemplary component mounting system in accordance with the present disclosure.

FIG. 1 is a block diagram showing an exemplary component mounting system in accordance with the present disclosure. As shown in this figure, a component mounting system MS includes a rotary type component mounter 1A and an in-line type component mounter 1B. These component mounters 1A and 1B are arranged in series in an X direction (horizontal direction), and the component mounters 1A and 1B mount components onto a board in this order. In other words, on the board on which the component mounter 1A mounts a component, the component mounter 1B mounts a component. The rotary type and in-line type component mounters 1A and 1B are different from each other mainly in the configuration of a mounting head. Thus, common points of these component mounters will be described with reference to FIG. 2 and then differences of these component mounters will be described.

Figure 2:
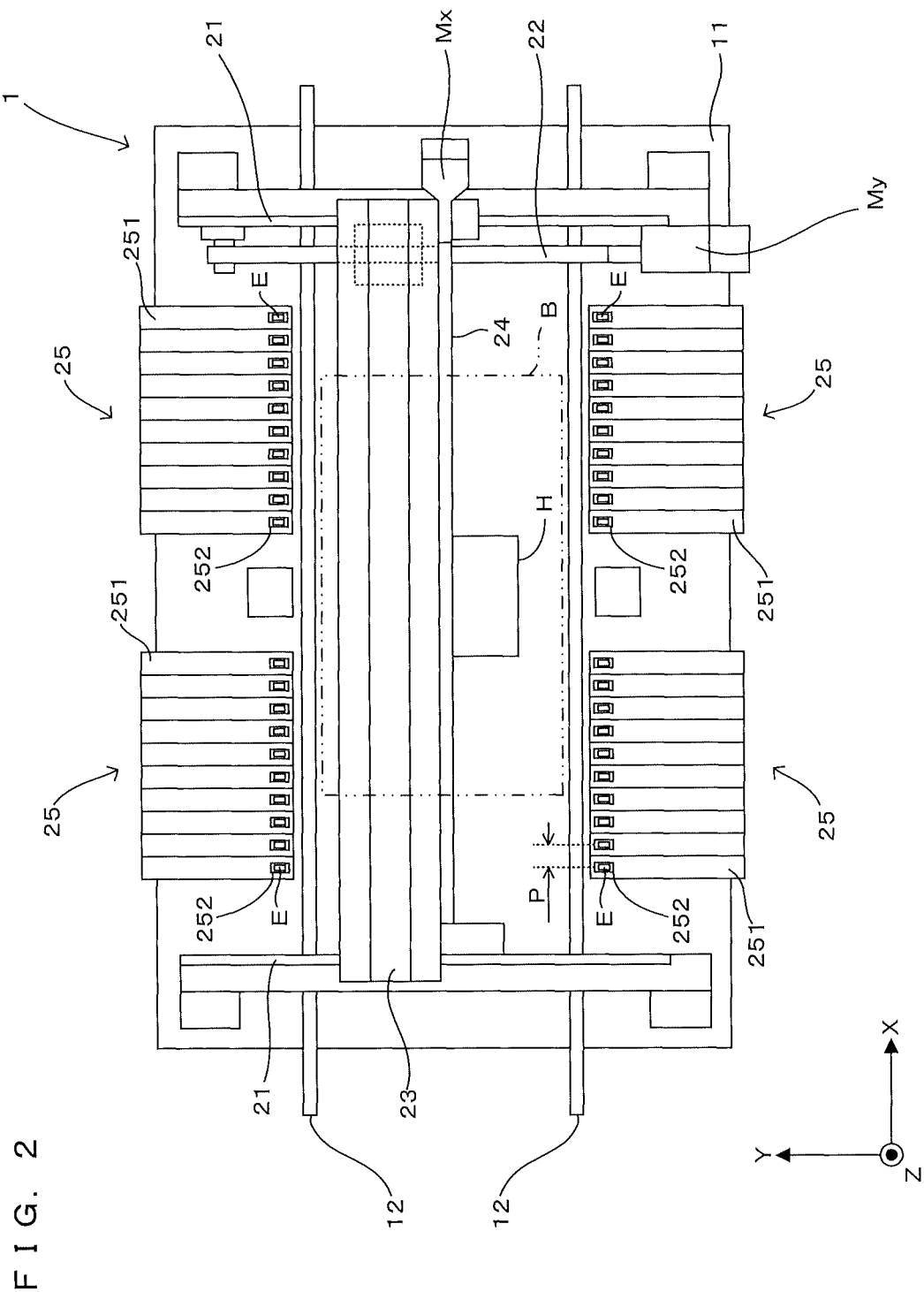
FIG. 2 is a view schematically showing a configuration included in common in rotary type and in-line type component mounters included in the component mounting system of FIG. 1.

FIG. 2 is a view schematically showing a configuration included in common in the rotary type and in-line type component mounters included in the component mounting system of FIG. 1. In FIG. 2 and the following figures, an X direction, a Y direction, and a Z direction are shown as appropriate. Herein, the X direction and the Y direction are each a horizontal direction and orthogonal to each other. The Z direction is a vertical direction orthogonal to the X direction and the Y direction. Further, the component mounter will be referred to as a component mounter 1 without particularly distinguishing between the rotary type and the in-line type.

The component mounter 1 includes a pair of conveyors 12 and 12 provided on a base 11. Then, the component mounter 1 mounts components on a board B loaded by the conveyor 12 to a working position (the position of the board B in FIG. 1) from the upstream side in the X direction (board transfer direction) and unloads the board B on which the component mounting is completed, by the conveyor 12 from the working position to the downstream side in the X direction.

The component mounter 1 is provided with a pair of Y-axis rails 21 and 21 extending in the Y direction, a Y-axis ball screw 22 extending in the Y direction, and a Y-axis motor My which rotationally drives the Y-axis ball screw 22, and an X-axis rail 23 is fixed to a nut of the Y-axis ball screw 22, being supported by the pair of Y-axis rails 21 and 21 movably in the Y direction. To the X-axis rail 23, attached are an X-axis ball screw 24 extending in the X direction and an X-axis motor Mx which rotationally drives the X-axis ball screw 24, and a mounting head H is fixed to a nut of the X-axis ball screw 24, being supported by the X-axis rail 23 movably in the X direction. Therefore, the Y-axis ball screw 22 can be rotated by the Y-axis motor My to move the mounting head H in the Y direction or the X-axis ball screw 24 can be rotated by the X-axis motor Mx to move the mounting head H in the X direction.

On each of both sides of the pair of conveyors 12 and 12 in the Y direction, two component supply parts 25 are aligned in the X direction, and in each of the component supply parts 25, a plurality of tape feeders 251 are arranged at a predetermined arrangement pitch P in the X direction. Each of the tape feeders 251 has a component supply position 252 at a tip portion on the side of the conveyor 12 and supplies a component E accommodated in a component supply tape to the component supply position 252. The component supply tape accommodates the component E in each of a plurality of pockets aligned at regular pitches, and the tape feeder 251 intermittently sends out the component supply tape at the pitch in the Y direction, to thereby supply the component E to the component supply position 252. The component E to be accommodated in the component supply tape is a chip-like electronic component such as an integrated circuit, a transistor, a capacitor, or the like.

The mounting head H uses a later-described nozzle to adsorb the component E from the tape feeder 251 and transfer the component E on the board B, to thereby mount the component E on the board B. The specific configuration of the mounting head H depends on whether the component mounter 1 is the rotary type or the in-line type. Subsequently, this point will be described.

Figure 3:
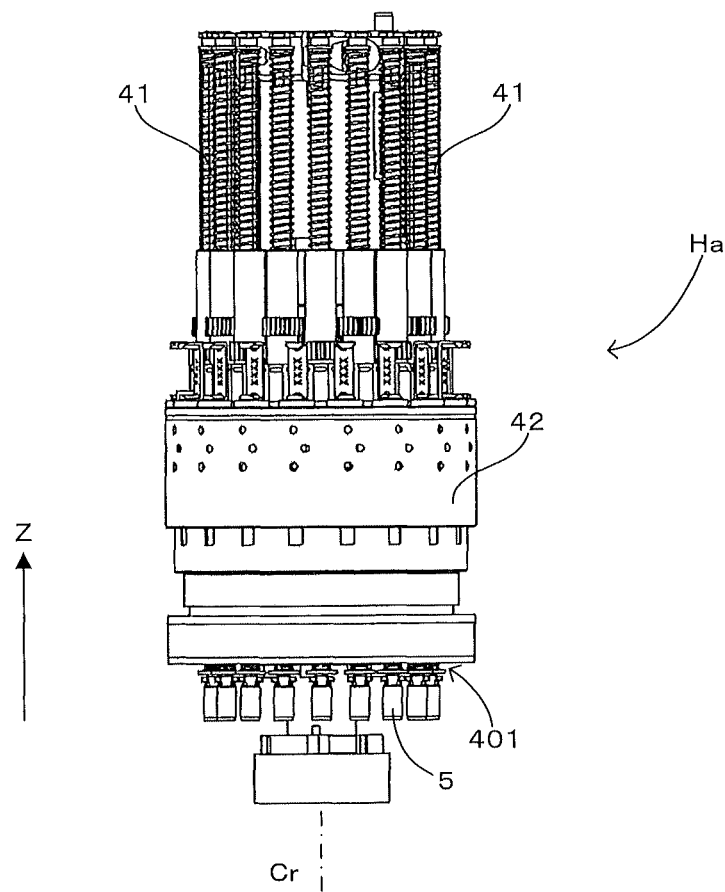
FIG. 3 is an elevational view partially showing a configuration of a rotary head included in a rotary type component mounter.
Figure 4:
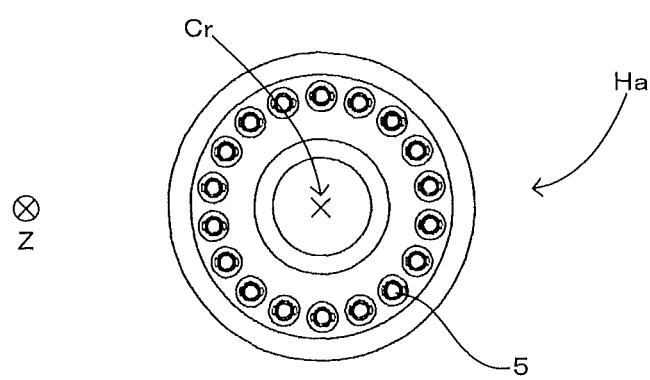
FIG. 4 is a bottom view partially showing a configuration of the rotary head included in the rotary type component mounter.

FIG. 3 is an elevational view partially showing a configuration of the rotary head included in the rotary type component mounter, and FIG. 4 is a bottom view partially showing a configuration of the rotary head included in the rotary type component mounter. The rotary head Ha included in the rotary type component mounter 1A has a plurality of rotary shafts 41 arranged circumferentially at regular pitches (for example, 10 degrees) around a center of rotation Cr and a shaft supporting member 42 supporting the rotary shafts 41. The shaft supporting member 42 has a substantially cylindrical shape around the center of rotation Cr and supports each of the rotary shafts 41 liftably in the Z direction. Further, the plurality of rotary shafts 41 are supported by the shaft supporting member 42 so that each of rotary shafts 41 is rotatably around a shaft center thereof in parallel with the Z direction.

Further, the rotary head Ha has a nozzle holding member 5 attached to a lower end 401 of each of the rotary shafts 41 projecting downward relative to the shaft supporting member 42. Then, the rotary head Ha gives a negative pressure to a nozzle attached to the nozzle holding member 5, to thereby cause the nozzle to adsorb the component E.

Figure 5:
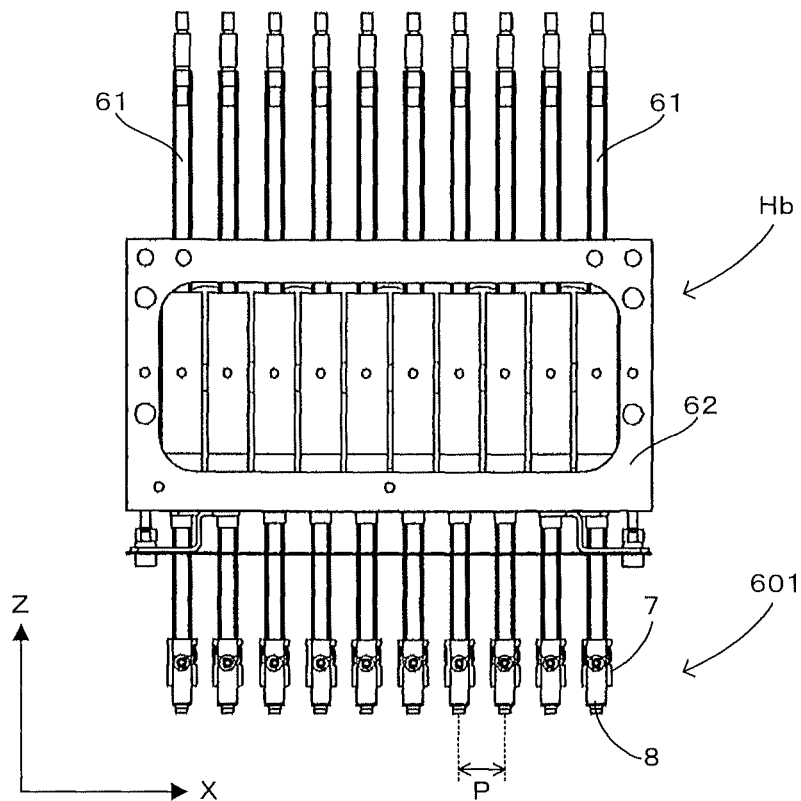
FIG. 5 is an elevational view partially showing a configuration of an in-line head included in an in-line type component mounter.
Figure 6:
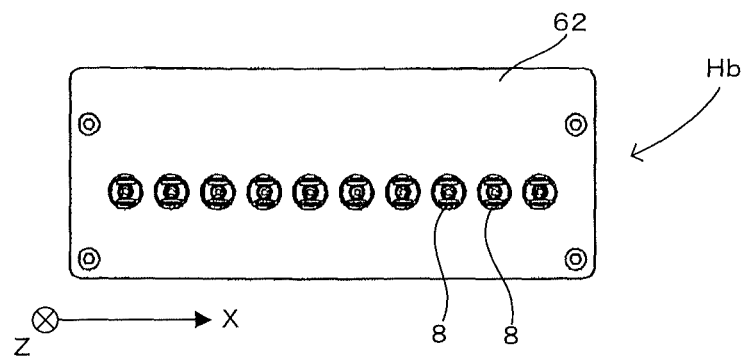
FIG. 6 is a bottom view partially showing a configuration of the in-line head included in the in-line type component mounter.

FIG. 5 is an elevational view partially showing a configuration of the in-line head included in the in-line type component mounter, and FIG. 6 is a bottom view partially showing a configuration of the in-line head included in the in-line type component mounter. The in-line head Hb included in the in-line type component mounter 1B has a plurality of in-line shafts 61 arranged linearly at the arrangement pitch P in the X direction and a shaft supporting member 62 supporting the in-line shafts 61. The shaft supporting member 62 supports each of the in-line shafts 61 liftably in the Z direction. Further, the plurality of in-line shafts 61 are supported by the shaft supporting member 62 so that each of in-line shafts 61 is rotatably around a shaft center thereof in parallel with the Z direction.

Further, the in-line head Hb has a nozzle holding member 7 provided on a lower end 601 of each of the in-line shafts 61 projecting downward relative to the shaft supporting member 62, and in the exemplary case of FIGS. 5 and 6, a nozzle 8 is attached to each of the nozzle holding members 7. Then, the in-line head Hb gives a negative pressure to the nozzle 8 attached to the nozzle holding member 7, to thereby cause the nozzle 8 to adsorb the component E. The arrangement pitch P at which the plurality of in-line shafts 61 are arranged in the in-line head Hb, in other words, the arrangement pitch P at which the plurality of nozzles 8 are arranged is equal to the arrangement pitch P at which the tape feeders 251 are arranged. Therefore, the in-line head Hb can adsorb the components E from the plurality of tape feeders 251 by the plurality of nozzles 8 at the same time.

Then, the nozzles 8 used in the component mounting system MS each have a configuration which can be attached to both the rotary head Ha and the in-line head Hb and can be shared by the rotary type and in-line type component mounters 1A and 1B. Subsequently, this point will be described.

Figure 7:
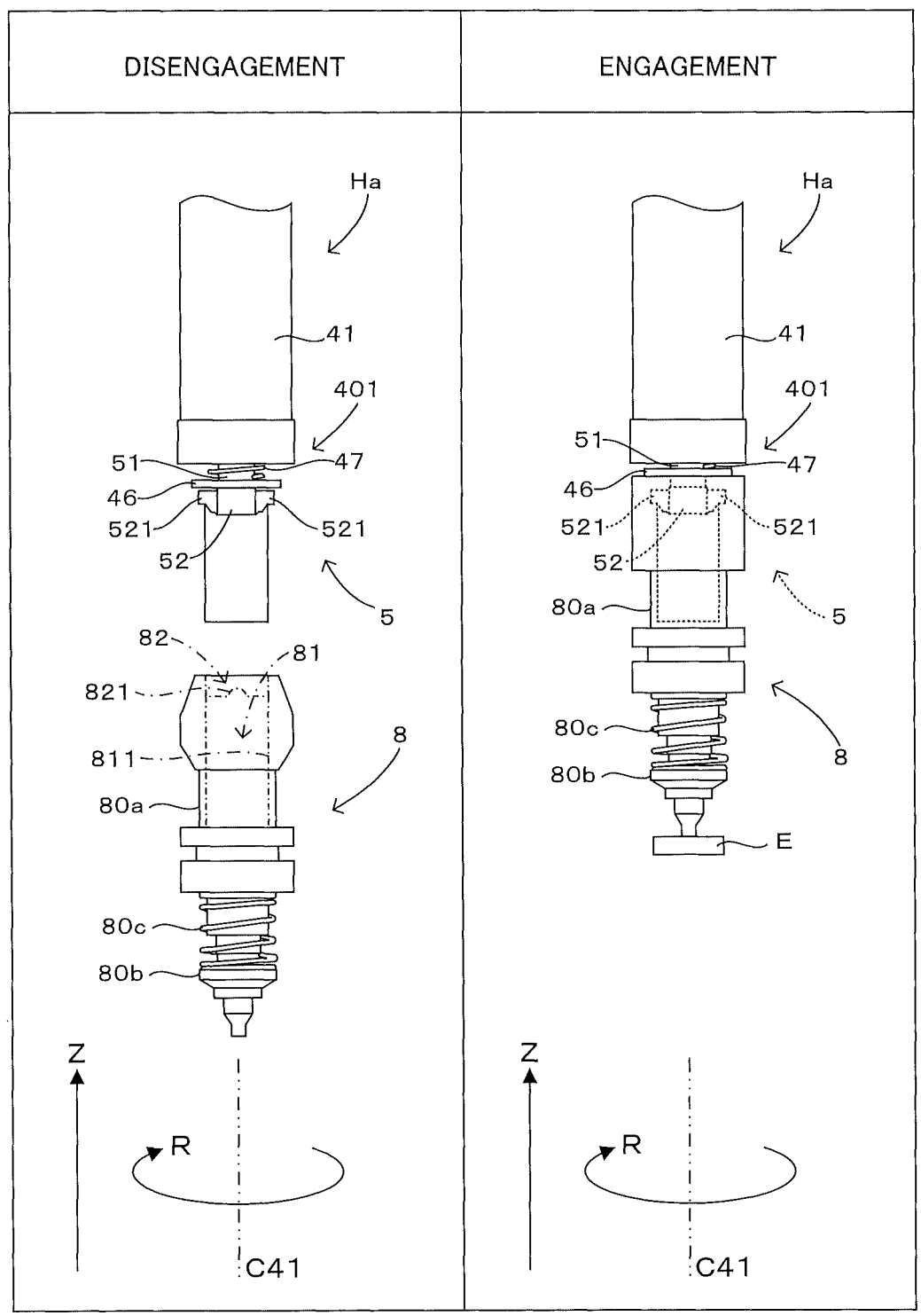
FIG. 7 is a partial elevational view schematically showing the vicinity of a lower end of a rotary shaft.
Figure 8:
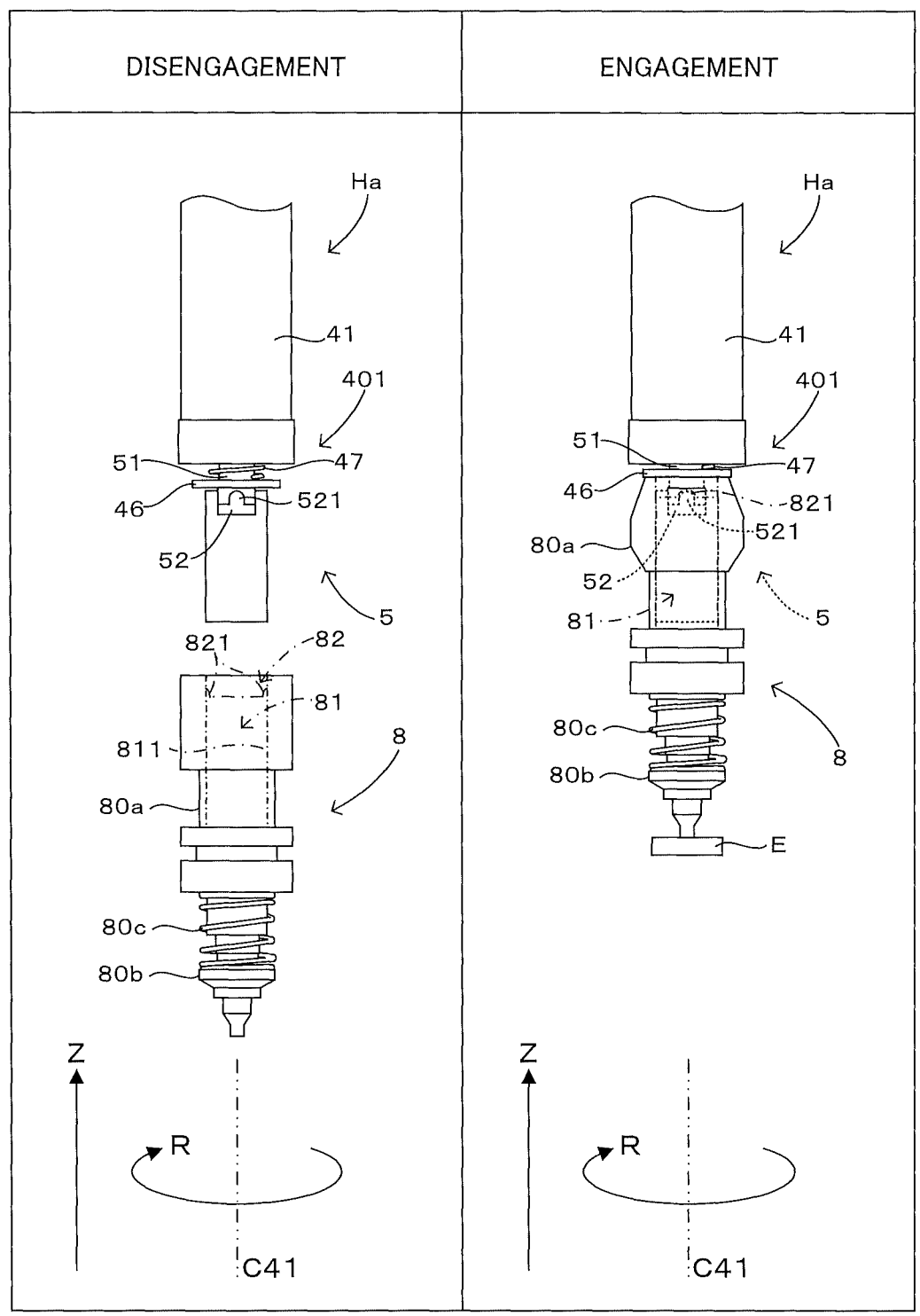
FIG. 8 is a partial side elevational view schematically showing the vicinity of the lower end of the rotary shaft.
Figure 9:
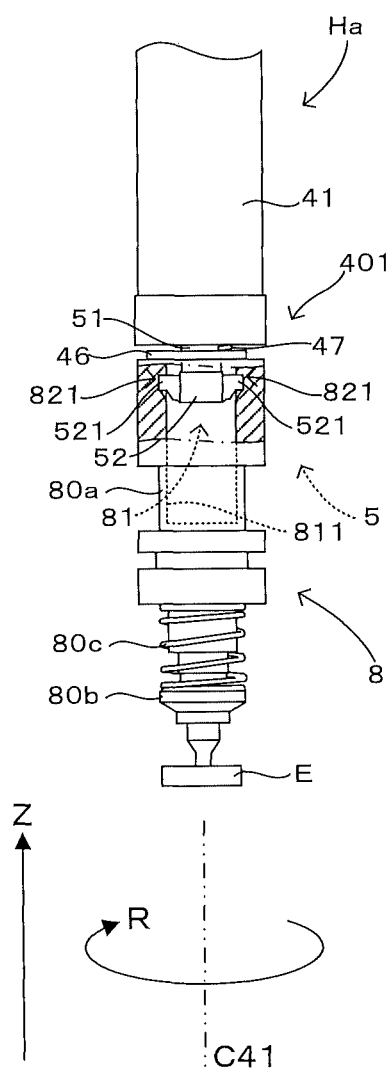
FIG. 9 is a partial notch cross section of the rotary shaft of FIG. 2.

FIG. 7 is a partial elevational view schematically showing the vicinity of the lower end of the rotary shaft, FIG. 8 is a partial side elevational view schematically showing the vicinity of the lower end of the rotary shaft, and FIG. 9 is a partial notch cross section of the rotary shaft of FIG. 2. In FIGS. 7 and 8, the column of "disengagement" shows a state where the nozzle 8 is disengaged from the rotary shaft 41 and the column of "engagement" shows a state where the nozzle 8 is engaged with the rotary shaft 41. FIG. 9 shows the state where the nozzle 8 is engaged with the rotary shaft 41. Further, in each of these figures, the component E adsorbed by the nozzle 8 which is engaged with the rotary shaft 41 is shown as appropriate. As shown in these figures, the rotary head Ha has the nozzle holding member 5 attached to the lower end 401 of the rotary shaft 41, and the nozzle 8 is attached to the nozzle holding member 5 detachably.

The nozzle holding member 5 has a main shaft 51 extending in the Z direction and an engaged portion 52 provided on a lower end of the main shaft 51. The engaged portion 52 has a pair of engaged projections 521 and 521 arranged at an interval of 180 degrees in a rotation direction R. Herein, the rotation direction R is a rotation direction about a shaft center C41 of the rotary shaft 41 in parallel with the Z direction. The engaged projections 521 and 521 have upward convex shapes protruding opposite to each other in the horizontal direction. Further, on the main shaft 51 of the nozzle holding member 5, a pressing plate 46 having an annular shape and a compression spring 47 having a coiled shape are externally fitted. In other words, the main shaft 51 is inserted into the pressing plate 46 and the compression spring 47. The pressing plate 46 which is provided thus above the engaged portion 52 has an annular shape having a diameter of an inner circumference which is smaller than the width of an upper end of the engaged portion 52 (distance between both ends of the engaged projections 521 and 521) and is hitched on the upper end of the engaged portion 52 so as not to be fallen downward. Further, the compression spring 47 provided above the pressing plate 46 has a coiled shape having a diameter larger than that of the inner circumference of the pressing plate 46 and smaller than that of an outer circumference of the pressing plate 46, and a lower end of the compression spring 47 is in contact with an upper surface of the pressing plate 46.

The nozzle 8 has the nozzle body 80a and the nozzle lower end portion 80b. The nozzle lower end portion 80b protrudes downward from the nozzle body 80a and is attached to the nozzle body 80a liftably in the Z direction. An adsorption hole is opened in a lower end of the nozzle lower end portion 80b, the component E is adsorbed by the nozzle lower end portion 80b by supplying a negative pressure to the adsorption hole in a state where the lower end of the nozzle lower end portion 80b is in contact with the component E. Further, the nozzle 8 has a buffer spring 80c biasing the nozzle lower end portion 80b downward with respect to the nozzle body 80a. The buffer spring 80c is a compression spring, and an upper end of the buffer spring 80c comes into contact with the nozzle body 80a from below and a lower end of the buffer spring 80c comes into contact with the nozzle lower end portion 80b from above.

The nozzle body 80a is provided with a hollow portion 81 which is opened upward and has a substantially cylindrical shape. An inner wall 811 of the hollow portion 81 is provided with the engagement portion 82, and the engagement portion 82 has a pair of engagement holes 821 and 821 which are arranged at an interval of 180 degrees in the rotation direction R and each recessed upward. Then, the nozzle 8 can be attached to the nozzle holding member 5 by engaging the engagement portion 82 of the nozzle 8 with the engaged portion 52 of the nozzle holding member 5 while inserting the engaged portion 52 of the nozzle holding member 5 into the hollow portion 81 of the nozzle 8 from above.

Specifically, attaching of the nozzle 8 is performed by the following operation. Further, herein, a manner in which the nozzle 8 is moved relative to the rotary shaft 41 will be described. These movements, however, are relative, and also by a manner in which the rotary shaft 41 is moved relative to the nozzle 8, the same operation is performed.

From the state of "disengagement" of FIG. 7, the pressing plate 46 is relatively pushed up by an upper surface of the nozzle 8 against a biasing force of the compression spring 47 while the hollow portion 81 of the nozzle 8 is externally fitted on the nozzle holding member 5 from below. Then, the nozzle 8 is relatively pushed up until the upper surface of the pressing plate 46 comes into proximity to or contact with the lower end 401 of the rotary shaft 41. The engaged projection 521 of the nozzle holding member 5 is thereby fitted into the hollow portion 81 of the nozzle 8, and the engagement hole 821 of the nozzle 8 is relatively raised up to above the engaged projection 521 of the nozzle holding member 5. When the rotation position (phase) of the engagement holes 821 and 821 and that of the engaged projections 521 and 521 are matched by rotating the nozzle 8 by 90 degrees with respect to the nozzle holding member 5 from this state, the engagement holes 821 and 821 are opposed to the engaged projections 521 and 521 from above.

Subsequently, when the nozzle 8 is relatively lowered in accordance with the biasing force of the compression spring 47, the engaged projections 521 and 521 are fitted into and engaged with the engagement holes 821 and 821 and the nozzle 8 is engaged with the engaged portion 52. Further, since the compression spring 47 biases the nozzle 8 downward through the pressing plate 46, the engagement between the engagement hole 821 of the nozzle 8 and the engaged projection 521 of the nozzle holding member 5 is kept by the biasing force of the compression spring 47. Thus, as shown in the column of "engagement" of FIG. 7, when the nozzle 8 is engaged with the nozzle holding member 5, an air supply path formed inside the rotary shaft 41 communicates with the nozzle 8, and a negative pressure can be supplied to the nozzle 8 through this air supply path.

Figure 10:
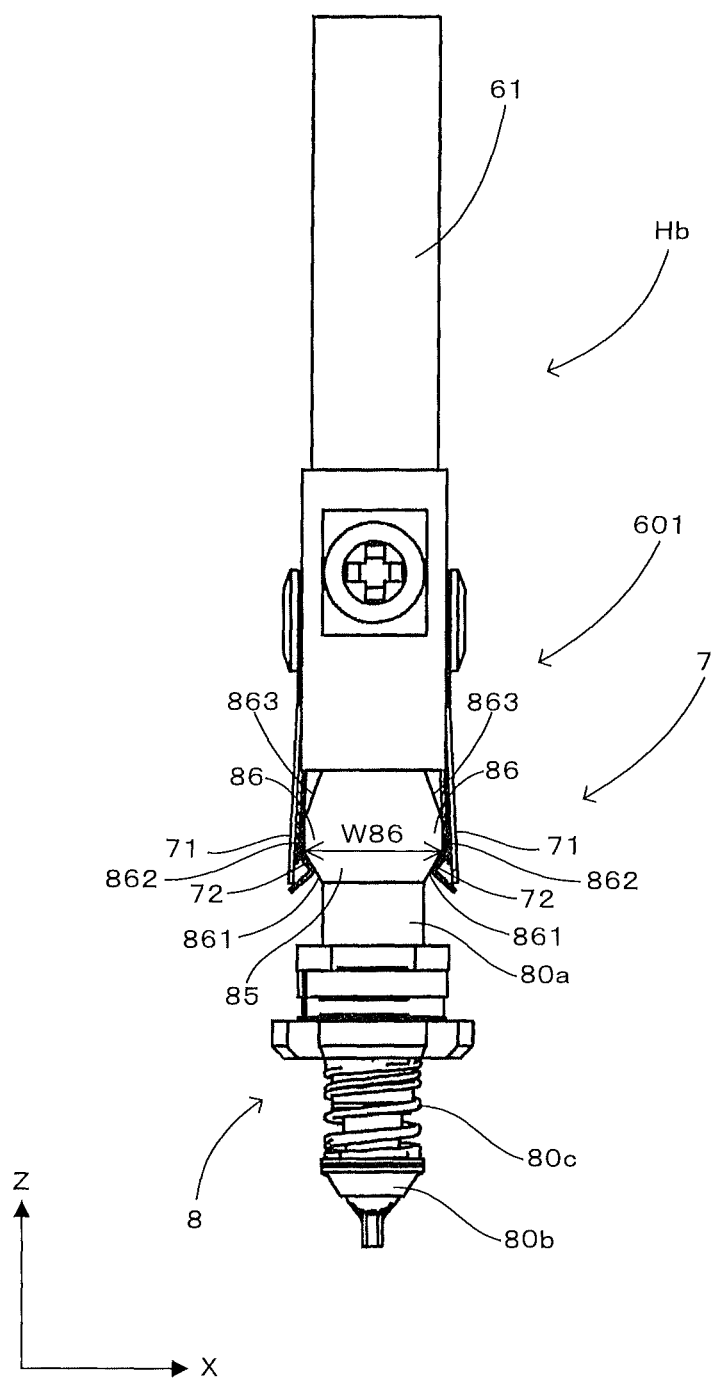
FIG. 10 is a partial elevational view schematically showing the vicinity of a lower end of an in-line shaft.

FIG. 10 is a partial elevational view schematically showing the vicinity of the lower end of the in-line shaft. As shown in FIG. 10, the in-line head Hb has the nozzle holding member 7 attached to the lower end 601 of the in-line shaft 61, and the nozzle 8 is attached to the nozzle holding member 7 detachably. The nozzle holding member 7 has a pair of flat springs 71 and 71 protruding downward from the lower end 601 of the in-line shaft 61 and an engaged projection 72 provided on a lower end of each of the flat springs 71. These pair of engaged projections 72 protrude sideward (in the X direction) toward the inside from the pair of flat springs 71.

On the other hand, on an outer wall 85 of the nozzle body 80*a*, provided are a pair of engagement projections 86 protruding sideward (in the X direction) at an upper end of the nozzle body 80*a*. Each of the engagement projections 86 includes a lower portion 861, a middle portion 862, and an upper portion 863, and the lower portion 861 is inclined outward toward the upside, the middle portion 862 is substantially in parallel with the Z direction, and the upper portion 863 is inclined inward toward the upside. The pair of engagement projections 86 are provided corresponding to the pair of engaged projections 72, and the maximum width W86 of the nozzle body 80*a* in a portion where the pair of engagement projections 86 are provided is larger than the interval of the pair of engaged projections 72 in a natural state of the pair of flat springs 71. Then, by inserting the pair of engagement projections 86 between the pair of engaged projections 72 from below, the nozzle 8 can be attached to the nozzle holding member 7.

Specifically, attaching of the nozzle 8 is performed by the following operation. Further, herein, a manner in which the nozzle 8 is moved relative to the in-line shaft 61 will be described. These movements, however, are relative, and also by a manner in which the in-line shaft 61 is moved relative to the nozzle 8, the same operation is performed.

Against an elastic force of the pair of flat springs 71, the pair of engagement projections 86 are caused to enter between the pair of engaged projections 72 from below. With entering of these engagement projections 86, the pair of engaged projections 72 are pushed outward by the upper portion 863 to be separated from each other and reach the lower portion 861 beyond the middle portion 862. The pair of engaged projections 72 reaching the lower portion 861 come closer each other by the elastic force of the flat springs 71 to engage with the lower portion 861 of the engagement projection 86 and support the engagement projection 86 from below. As a result, the engagement between the engagement projection 86 of the nozzle 8 and the engaged projection 72 of the nozzle holding member 7 is kept by the elastic force of the pair of flat spring 71. Thus, as shown in FIG. 10, when the nozzle 8 is engaged with the nozzle holding member 7, an air supply path formed inside the in-line shaft 61 communicates with the nozzle 8, and a negative pressure can be supplied to the nozzle 8 through this air supply path.

In the above-described embodiment, on the outer wall 85 (outside) of the nozzle body 80*a* of the nozzle 8 (component adsorption nozzle), provided are the pair of engagement projections 86 protruding sideward (in the X direction). On the other hand, on the lower end 601 of the in-line shaft 61, the pair of flat springs 71 are attached, and the pair of engaged projections 72 are provided on the lower end of the pair of flat springs 71. These pair of engagement projections 86 are engaged with the pair of engaged projections 72 from above by entering between the pair of engaged projections 72 from below while separating the pair of engaged projections 72 sideward (in the X direction) from each other against the elastic force of the pair of flat springs 71. Then, with the engagement between the engagement projection 86 of the nozzle 8 and the engaged projection 72 of the nozzle holding member 7 being kept by the elastic force of the pair of flat springs 71, the nozzle 8 is attached to the in-line shaft 61.

Further, the nozzle body 80*a* of the nozzle 8 is provided with the hollow portion 81 (fitting hole) which is opened upward and the engagement portion 82 provided on the inner wall 811 (inside) of the hollow portion 81. Into this hollow portion 81, the engaged portion 52 provided on the lower end 401 of the rotary shaft 41 is fitted from above, and the engagement portion 82 of the nozzle 8 is engaged with the engaged portion 52 of the nozzle holding member 5 which is fitted into the hollow portion 81 by coming into contact with the engaged portion 52 from above. Then, with the engagement between the engagement portion 82 and the engaged portion 52 being kept by biasing the nozzle 8 downward by the compression spring 47 (biasing member) included in the rotary head Ha, the nozzle 8 is attached to the rotary shaft 41.

Thus, the nozzle 8 of the present embodiment can be attached to both of the in-line shaft 61 and the rotary shaft 41 by utilizing the outside (outer wall 85) of the nozzle body 80*a* for attaching to the in-line shaft 61 and utilizing the inside (inner wall 811) of the nozzle body 80*a* for attaching to the rotary shaft 41. Therefore, for a user who owns each of the in-line type and rotary type component mounters 1A and 1B, it is not necessary to prepare a nozzle dedicated to each type component mounter and it is possible to reduce the burden required for preparing the nozzle.

Further, the engagement portion 82 has the engagement hole 821 (recessed portion) having a concave shape, the engaged portion 52 has the engaged projection 521 (protruding portion) having a convex shape, and the engagement hole 821 of the engagement portion 82 and the engaged projection 521 of the engaged portion 52 are engaged with each other. In such a configuration, the nozzle 8 can be attached to the rotary head Ha with a simple configuration in which the recessed portion and the protruding portion are engaged with each other.

Figure 11:
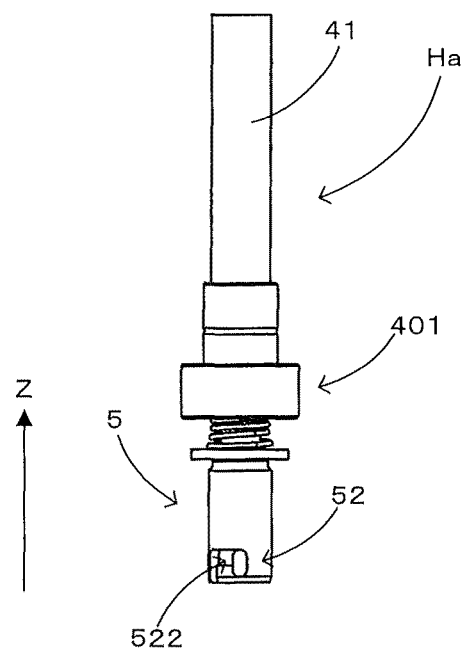
FIG. 11 is a partial elevational view showing the vicinity of the lower end of the rotary shaft in accordance with a variation.
Figure 12:
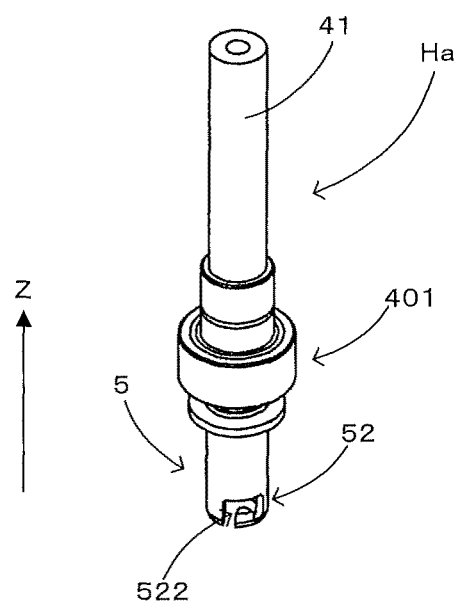
FIG. 12 is an upper perspective view showing the vicinity of the lower end of the rotary shaft in accordance with the variation.
Figure 13:
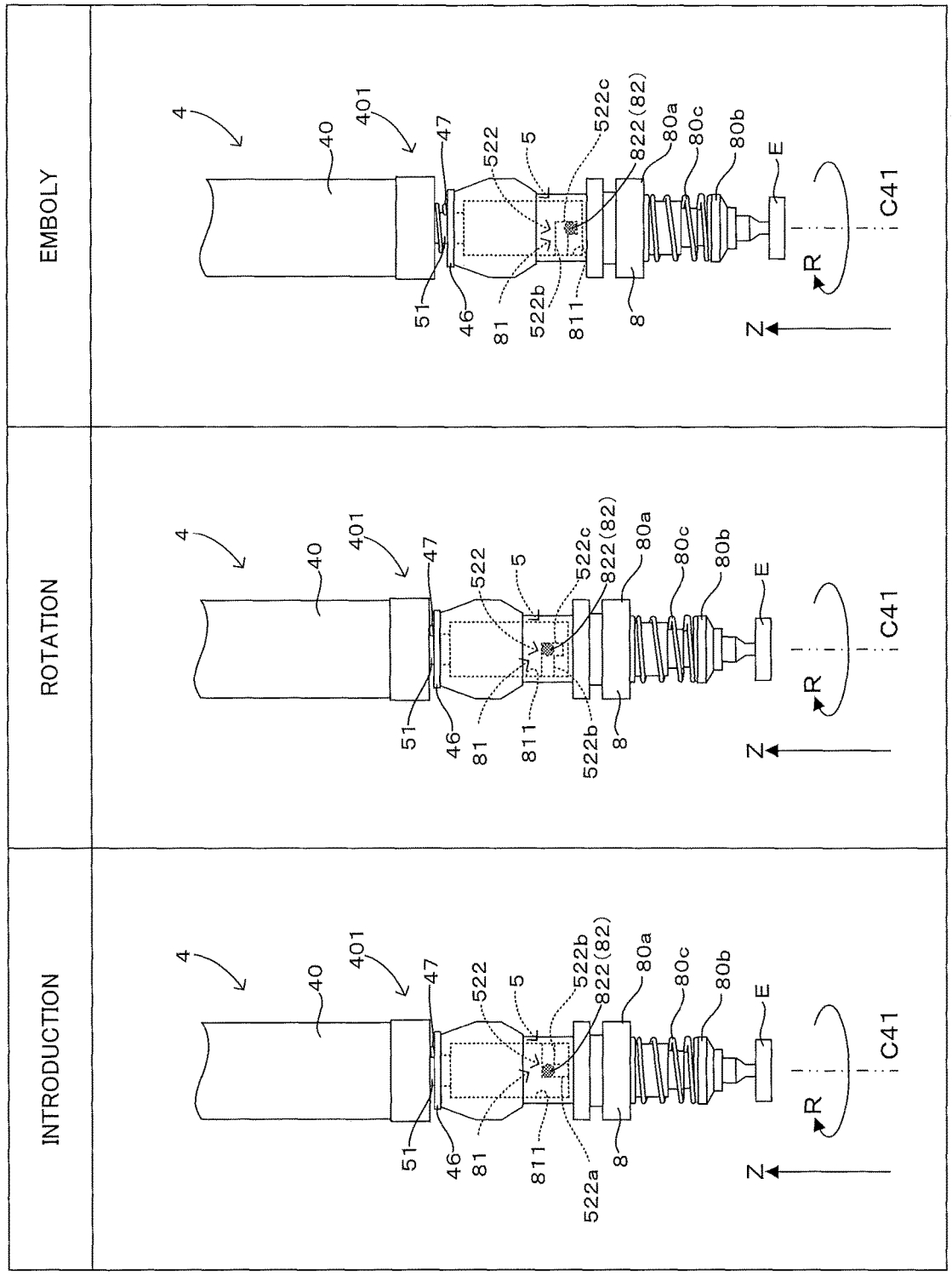
FIG. 13 is a view schematically showing a attaching mechanism of the rotary shaft and the nozzle in accordance with the variation.

Attaching of the nozzle 8 on the rotary shaft 41 can be achieved by the following mechanism, instead of the mechanism exemplarily shown in FIGS. 7 to 9. FIG. 11 is a partial elevational view showing the vicinity of the lower end of the rotary shaft in accordance with a variation, FIG. 12 is an upper perspective view showing the vicinity of the lower end of the rotary shaft in accordance with the variation, and FIG. 13 is a view schematically showing a attaching mechanism of the rotary shaft and the nozzle in accordance with the variation. Further, the above-described exemplary case and this variation are different from each other in the attaching mechanism of the nozzle 8 onto the rotary shaft 41 and are common in the attaching mechanism of the nozzle 8 onto the in-line shaft 61. Therefore, herein, the former will be described, and as to the latter, the corresponding reference signs are given and description thereof will be omitted.

In accordance with this variation, the engaged portion 52 of the nozzle holding member 5 attached to the lower end 401 of the rotary shaft 41 has an engaged groove 522. This engaged groove 522 has an introduction vertical portion 522*a*, a horizontal portion 522*b*, and an emboly vertical portion 522*c*. The introduction vertical portion 522*a* is opened downward and extends in parallel with the Z direction, the emboly vertical portion 522*c* is provided at an interval with the introduction vertical portion 522*a* in the rotation direction R and extends in parallel with the Z direction, and the horizontal portion 522*b* extends in the rotation direction R between an upper end of the introduction vertical portion 522*a* and an upper end of the emboly vertical portion 522*c*. On the other hand, the engagement portion 82 of the nozzle 8 has an engagement protruding portion 822 protruding from the inner wall 811 of the hollow portion 81. Then, the nozzle 8 can be attached to the nozzle holding member 5 by engaging the engagement portion 82 of the nozzle 8 with the engaged portion 52 of the nozzle holding member 5 while inserting the engaged portion 52 of the nozzle holding member 5 into the hollow portion 81 from above.

Specifically, attaching of the nozzle 8 is performed by the following operation. Further, herein, a manner in which the nozzle 8 is moved relative to the rotary shaft 41 will be described. These movements, however, are relative, and also by a manner in which the rotary shaft 41 is moved relative to the nozzle 8, the same operation is performed.

The engagement protruding portion 822 of the nozzle 8 is caused to face the introduction vertical portion 522a of the engaged groove 522 of the nozzle holding member 5 from below and enter the introduction vertical portion 522a (the column of "introduction" in FIG. 13). Such entering of the engagement protruding portion 822 to the introduction vertical portion 522a is performed while raising the nozzle 8 relative to the nozzle holding member 5 against the biasing force of the compression spring 47 which biases the nozzle 8 downward through the pressing plate 46. When the engagement protruding portion 822 reaches the upper end of the introduction vertical portion 522a, by rotating the nozzle 8 in the rotation direction R, the engagement protruding portion 822 is moved from the introduction vertical portion 522a to the emboly vertical portion 522c along the horizontal portion 522b (the column of "rotation" in FIG. 13).

As the engagement protruding portion 822 reaches the upper end of the emboly vertical portion 522c, when the nozzle 8 is lowered relative to the nozzle holding member 5 in accordance with the biasing force of the compression spring 47, the engagement protruding portion 822 is fitted into the emboly vertical portion 522c, and the engagement protruding portion 822 of the nozzle 8 and the engaged groove 522 of the nozzle holding member 5 are engaged with each other. Further, since the compression spring 47 biases the nozzle 8 downward through the pressing plate 46, the engagement between the engagement protruding portion 822 of the nozzle 8 and the engaged groove 522 of the nozzle holding member 5 is kept by the biasing force of the compression spring 47. Thus, as shown in the column of "emboly" of FIG. 13, when the nozzle 8 is engaged with the nozzle holding member 5, the air supply path formed inside the rotary shaft 41 communicates with the nozzle 8, and a negative pressure can be supplied to the nozzle 8 through this air supply path.

Thus, the nozzle 8 of the variation can be also attached to both of the in-line shaft 61 and the rotary shaft 41 by utilizing the outside (outer wall 85) of the nozzle body 80a for attaching to the in-line shaft 61 and utilizing the inside (inner wall 811) of the nozzle body 80a for attaching to the rotary shaft 41. Therefore, for a user who owns each of the in-line type and rotary type component mounters 1A and 1B, it is not necessary to prepare a nozzle dedicated to each type component mounter and it is possible to reduce the burden required for preparing the nozzle.

Further, the engagement portion 82 has the engagement protruding portion 822 (protruding portion), the engaged portion 52 has the engaged groove 522 (recessed portion), and the engagement protruding portion 822 of the engagement portion 82 and the engaged groove 522 of the engaged portion 52 are engaged with each other. In such a configuration, the nozzle 8 can be attached to the rotary head Ha with a simple configuration in which the recessed portion and the protruding portion are engaged with each other.

As described above, in the present embodiment, the component mounter 1A corresponds to an exemplary "rotary type component mounter" of the present disclosure, the component mounter 1B corresponds to an exemplary "in-line type component mounter" of the present disclosure, the rotary shaft 41 corresponds to an exemplary "rotary shaft" of the present disclosure, the lower end 401 corresponds to an exemplary "lower end of the rotary shaft" of the present disclosure, the compression spring 47 corresponds to an exemplary "biasing member" of the present disclosure, the engaged portion 52 corresponds to an exemplary "engaged portion" of the present disclosure, and the engaged projection 521 corresponds to an exemplary "protruding portion" of the present disclosure. Also, the engaged groove 522 corresponds to an exemplary "recessed portion" of the present disclosure, the in-line shaft 61 corresponds to an exemplary "in-line shaft" of the present disclosure, the lower end 601 corresponds to an exemplary "lower end of the in-line shaft" of the present disclosure, the flat spring 71 corresponds to an exemplary "elastic member" of the present disclosure, and the engaged projection 72 corresponds to an exemplary "engaged projection" of the present disclosure. In addition, the nozzle 8 corresponds to an exemplary "component adsorption nozzle" of the present disclosure, the nozzle body 80a corresponds to an exemplary "nozzle body" of the present disclosure, the nozzle lower end portion 80b corresponds to an exemplary "nozzle lower end portion" of the present disclosure, the buffer spring 80c corresponds to an exemplary "buffer member" of the present disclosure, the hollow portion 81 corresponds to an exemplary "fitting hole" of the present disclosure, the engagement portion 82 corresponds to an exemplary "engagement portion" of the present disclosure, the engagement hole 821 corresponds to an exemplary "recessed portion" of the present disclosure, the engagement protruding portion 822 corresponds to an exemplary "protruding portion" of the present disclosure, and the engagement projection 86 corresponds to an exemplary "engagement projection" of the present disclosure. Furthermore, the component E corresponds to an exemplary "component" of the present disclosure, the rotary head Ha corresponds to an exemplary "rotary head" of the present disclosure, the in-line head Hb corresponds to an exemplary "in-line head" of the present disclosure, and the component mounting system MS corresponds to an exemplary "component mounting system" of the present disclosure.

Further, the present disclosure is not limited to the above-described embodiment, and numerous modifications and variations can be added to those described above without departing from the scope of the disclosure. For example, the number of engaged projections 521 in the engaged portion 52 or the number of engagement holes 821 in the engagement portion 82 is not limited to two as described above.

Furthermore, the number of flat springs 71, engaged projections 72, or engagement projections 86 is not limited to a pair as described above, but there may be a configuration where two pairs of flat springs 71, two pairs of engaged projections 72, and two pairs of engagement projections 86 are provided and the nozzle 8 is held from four sides.

Further, the number of rotary shafts 41 in the rotary head Ha or the number of in-line shafts 61 in the in-line head Hb may be changed as appropriate. Furthermore, though the plurality of in-line shafts 61 are aligned in a row in the in-line head Hb in the above-described exemplary case, the number of rows of the main shafts 51 is not limited to one but the main shafts 51 may be arranged in a plurality of rows.

What is claimed is:
1. A component adsorption nozzle, comprising:
   a nozzle body having a fitting hole which is opened upward;
   an engagement portion provided inside the fitting hole;

a pair of engagement projections provided outside the nozzle body, projecting sideward;

a nozzle lower end portion attached to the nozzle body movably up and down, and which is configured to come into contact with a component in order to adsorb the component; and a buffer member biasing the nozzle lower end portion downward with respect to the nozzle body, wherein an engaged portion provided on a lower end of one of a plurality of rotary shafts which are arranged circumferentially and included in a rotary head is configured to fit into the fitting hole from above, the engagement portion is configured to engage with the engaged portion by coming into contact from above with the engaged portion which is fitted into the fitting hole, engagement between the engagement portion and the engaged portion is maintained by biasing the nozzle body downward by a biasing member of the rotary head, the pair of engagement projections are configured for engagement from above with a pair of engaged projections provided on a pair of elastic members, respectively, which are provided on a lower end of one of a plurality of in-line shafts which are arranged linearly and included in an in-line head, by entering between the pair of engaged projections from below while separating the pair of engaged projections from each other against an elastic force of the elastic members, and engagement between the engagement projections and the engaged projections is maintained by the elastic force of the pair of elastic members.

2. The component adsorption nozzle according to claim 1, wherein the engagement portion has a recessed portion and the engaged portion has a protruding portion, and the recessed portion of the engagement portion and the protruding portion of the engaged portion are configured to engage with each other.

3. The component adsorption nozzle according to claim 1, wherein the engagement portion has a protruding portion and the engaged portion has a recessed portion, and the protruding portion of the engagement portion and the recessed portion of the engaged portion are configured to engage with each other.

4. A component mounting system, comprising:

a rotary type component mounter including a rotary head, which has a plurality of rotary shafts arranged circumferentially, and configured to mount a component onto a board by adsorbing the component by a component adsorption nozzle attached to a lower end of one of the rotary shafts; and an in-line type component mounter including an in-line head, which has a plurality of in-line shafts arranged linearly, and configured to mount a component onto a board by adsorbing the component by a component adsorption nozzle attached to a lower end of one of the in-line shafts, wherein the component adsorption nozzle comprises:

a nozzle body having a fitting hole which is opened upward, an engagement portion provided inside the fitting hole, a pair of engagement projections provided outside the nozzle body, projecting sideward, a nozzle lower end portion attached to the nozzle body movably up and down, which is configured to come into contact with a component in order to adsorb the component, and a buffer member biasing the nozzle lower end portion downward with respect to the nozzle body, and wherein an engaged portion provided on a lower end of one of the plurality of rotary shafts is configured to fit into the fitting hole from above, the engagement portion is configured to engage with the engaged portion by coming into contact from above with the engaged portion which is fitted into the fitting hole, engagement between the engagement portion and the engaged portion is maintained by biasing the nozzle body downward by a biasing member of the rotary head, the pair of engagement projections are configured for engagement from above with a pair of engaged projections provided on a pair of elastic members, respectively, which are provided on a lower end of one of a plurality of in-line shafts which are arranged linearly and included in an in-line head, by entering between the pair of engaged projections from below while separating the pair of engaged projections from each other against an elastic force of the elastic members, and engagement between the engagement projections and the engaged projections is maintained by the elastic force of the pair of elastic members.

* * * * *